(12) United States Patent
Simons et al.

(10) Patent No.: US 11,061,336 B2
(45) Date of Patent: Jul. 13, 2021

(54) DEVICE MANUFACTURING METHOD

(71) Applicant: ASML NETHERLANDS B.V., Veldhoven (NL)

(72) Inventors: Hubertus Johannes Gertrudus Simons, Venlo (NL); Everhardus Cornelis Mos, Best (NL); Xiuhong Wei, Eindhoven (NL); Reza Mahmoodi Baram, Veldhoven (NL); Hadi Yagubizade, Eindhoven (NL); Yichen Zhang, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/493,835

(22) PCT Filed: Mar. 28, 2018

(86) PCT No.: PCT/EP2018/057982
§ 371 (c)(1),
(2) Date: Sep. 13, 2019

(87) PCT Pub. No.: WO2018/197146
PCT Pub. Date: Nov. 1, 2018

(65) Prior Publication Data
US 2020/0081353 A1   Mar. 12, 2020

(30) Foreign Application Priority Data

Apr. 26, 2017 (EP) .................................. 17168204
Jul. 31, 2017 (EP) .................................. 17184009

(51) Int. Cl.
*G03B 27/68* (2006.01)
*G03F 7/20* (2006.01)

(52) U.S. Cl.
CPC .......... *G03F 7/70516* (2013.01); *G03F 7/706* (2013.01); *G03F 7/70633* (2013.01)

(58) Field of Classification Search
CPC ... G03F 7/70516; G03F 7/706; G03F 7/70633
See application file for complete search history.

(56) References Cited

U.S. PATENT DOCUMENTS

2002/0111038 A1   8/2002   Matsumoto et al.
2009/0168034 A1   7/2009   Staecker et al.
(Continued)

FOREIGN PATENT DOCUMENTS

CN   102754035   10/2012
EP   1251402     10/2002
(Continued)

OTHER PUBLICATIONS

International Search Report and Written Opinion issued in corresponding PCT Patent Application No. PCT/EP2018/057982, dated May 11, 2018.
(Continued)

*Primary Examiner* — Peter B Kim
(74) *Attorney, Agent, or Firm* — Pillsbury Winthrop Shaw Pittman LLP

(57) ABSTRACT

A device manufacturing method includes: exposing a first substrate using a lithographic apparatus to form a patterned layer having first features; processing the first substrate to transfer the first features into the first substrate; determining displacements of the first features from their nominal positions in the first substrate; determining a correction to at least partly compensate for the displacements; and exposing a second substrate using a lithographic apparatus to form a patterned layer having the first features, wherein the correction is applied for or during the exposing the second substrate.

20 Claims, 5 Drawing Sheets

(56) References Cited

U.S. PATENT DOCUMENTS

| | | |
|---|---|---|
| 2009/0296055 A1 | 12/2009 | Ye et al. |
| 2011/0001978 A1 | 1/2011 | Smilde et al. |
| 2011/0216293 A1 | 9/2011 | Padiy et al. |
| 2012/0008127 A1 | 1/2012 | Tel et al. |
| 2012/0244461 A1 | 9/2012 | Nagai |
| 2014/0047397 A1 | 2/2014 | Ye et al. |
| 2014/0168620 A1 | 6/2014 | Schmitt-Weaver et al. |

FOREIGN PATENT DOCUMENTS

| | | | |
|---|---|---|---|
| EP | 1843210 | 10/2007 | |
| JP | 2012004564 | 1/2012 | |
| WO | 2016146217 | 9/2016 | |
| WO | 2016206965 | 12/2016 | |
| WO | WO-2016206965 A1 * | 12/2016 | ......... G03F 7/70258 |

OTHER PUBLICATIONS

Taiwanese Office Action issued in corresponding Taiwanese Patent Application No. 107112851, dated Jan. 22, 2019.
Chinese Office Action issued in corresponding Chinese Patent Application No. 201880027060.9, dated Mar. 12, 2021.
Korean Office Action issued in corresponding Korean Patent Application No. 10-2019-7032070, dated Apr. 16, 2021.

\* cited by examiner

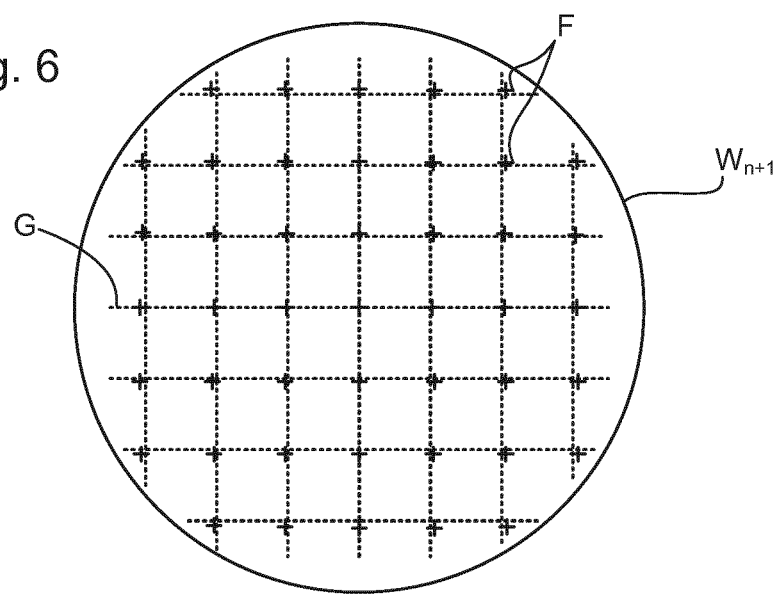

DEVICE MANUFACTURING METHOD

CROSS-REFERENCE TO RELATED APPLICATIONS

This application is the U.S. national phase entry of PCT Patent Application No. PCT/EP2018/057982, which was filed on Mar. 28, 2018, which claims the benefit of priority of European patent application no. 17168204.0, which was filed on Apr. 26, 2017, and European patent application no. 17184009.3, which was filed on Jul. 31, 2017, each of which is incorporated herein in its entirety by reference.

BACKGROUND

Field of the Invention

The present invention relates to device manufacturing using lithographic apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Most semiconductor devices require a plurality of pattern layers to be formed and transferred into the substrate. For proper functioning of the device, there is usually a limit on the tolerable positioning error (known in the art as overlay) between successive layers. With the continual desire in the lithographic art to reduce the size of features that can be formed (shrink) the limits on overlay are becoming stricter.

Overlay can arise from a variety of causes in the lithographic process, for example errors in the positioning of the substrate during exposure and aberrations in the projected image. Overlay can also be caused during process steps, such as etching, which are used to transfer the pattern into the substrate. Some such process steps generate stresses within the substrate that lead to local or global distortions of the substrate. The formation of three dimensional structures on the substrate, such as is required for recently developed memory types and MEMS, can also lead to significant distortions of the substrate.

SUMMARY OF THE INVENTION

The present invention aims to provide improved lithographic device manufacturing processes which can address process-induced distortions.

The invention in a first aspect provides a device manufacturing method comprising:

exposing a first substrate using a lithographic apparatus to form a patterned layer comprising first features;

processing the first substrate to transfer the first features into the first substrate;

determining displacements of the first features from their nominal positions in the first substrate;

determining a correction to at least partly compensate for the displacements; and exposing a second substrate using a lithographic apparatus to form a patterned layer comprising the first features;

wherein the correction is applied during the exposing the second substrate.

BRIEF DESCRIPTION OF THE DRAWINGS/FIGURES

Embodiments of the invention will now be described, by way of example, with reference to the accompanying drawings in which:

FIG. 6 depicts a substrate on which a grid of features is printed at adapted positions.

DETAILED DESCRIPTION

Before describing embodiments of the invention in detail, it is instructive to present an example environment in which embodiments of the present invention may be implemented.

Figure 1:
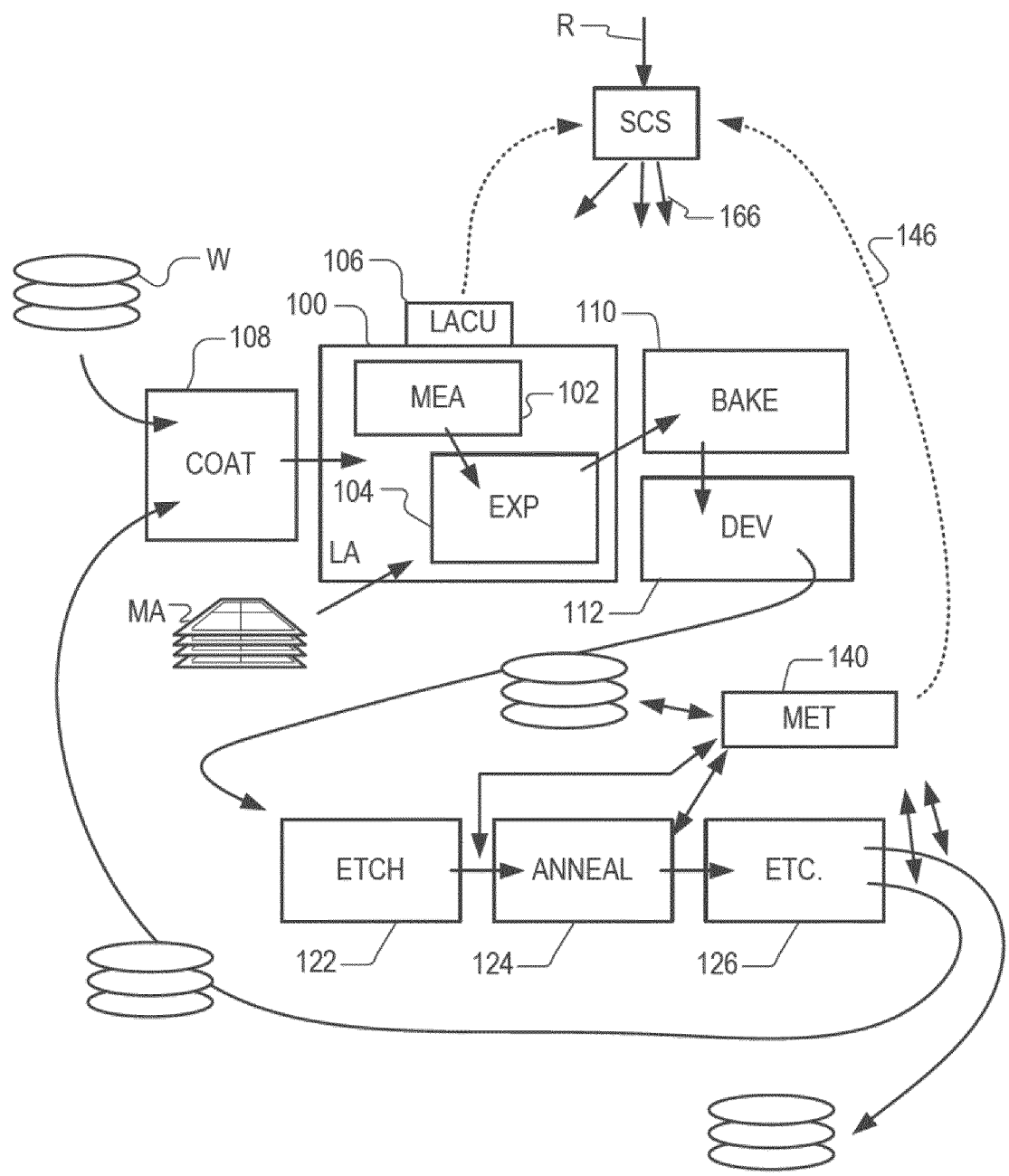
FIG. 1 depicts a lithographic apparatus together with other apparatuses forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors. Alignment marks are typically created as part of the product image forming the reference to which overlay is measured. Alternatively alignment marks of a previously formed layer can be used.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. A CD metrology target is used for measuring the result of the most recently exposed layer. An overlay target is used for measuring the difference between the positions of the previous and most recent layers. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus is configured to inspect substrates after development (112) or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

In the manufacture of semiconductor devices, accuracy of layer-to-layer positioning is important and limitations on tolerable overlay are becoming ever stricter with the continual desire in the industry to form smaller features. A variety of control and compensation systems exist to minimize overlay, especially overlay due to causes internal to the lithographic apparatus. In addition, overlay can be caused by process steps such as etching, deposition, polishing (CMP) and annealing. These, and potentially other, process steps can cause global and local distortions of the substrate, especially if the substrate is stressed when the process step is performed. It is difficult to control and reduce these distortions.

It is known to measure distortions of a substrate, e.g. by measuring the relative positions of alignment marks, after a process step and to apply corrections in the patterning of subsequent layers on that substrate. In effect, subsequent layers are deliberately shifted and/or distorted to match the distortion caused on previous layers by the process steps. The resulting distortions in the finished device are usually not critical to its functioning in the way that misalignment of layers would be.

Although this known form of feedback control can be effective in many circumstances, with many layers and correspondingly many process steps the distortions accumulate and become more complex. Accordingly, the necessary corrections may exceed the capabilities of the lithographic apparatus. In many cases not all layers of a device are equally critical and so different layers of a device may be imaged using different types of lithographic apparatus. The different lithographic apparatus may not all have the same capabilities to apply pattern corrections to compensate for overlay. Therefore, the known feedback control mechanism may not be able to provide adequate compensation for process-induced distortions in all circumstances.

Figure 2:
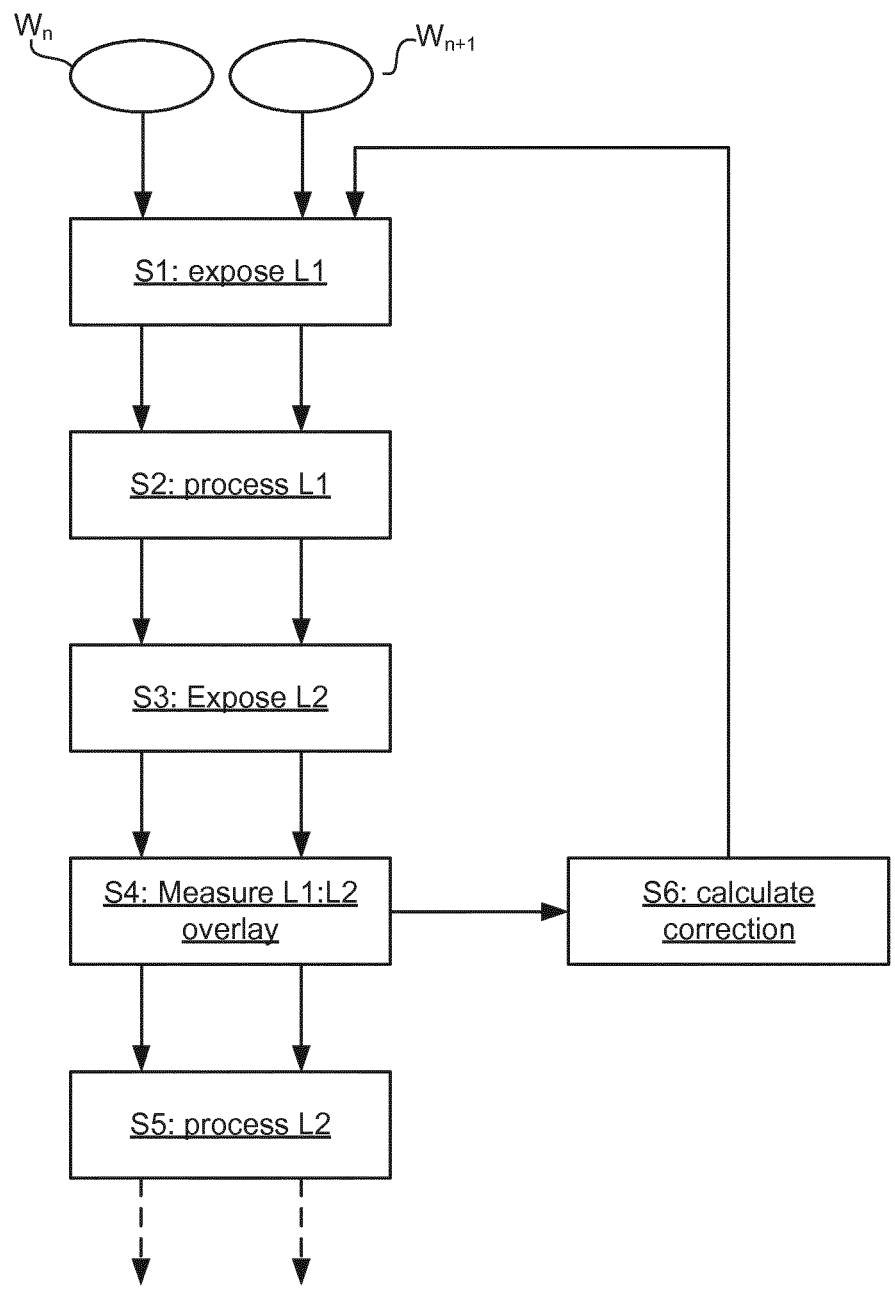
FIG. 2 depicts a flow chart of a method according to an embodiment of the invention.

A process according to an embodiment of the present invention is depicted in FIG. 2 of the accompanying drawings. A first substrate $W_n$ is exposed (step S1) to form first layer L1 and processed (step S2) to transfer layer 1 into the substrate. The process step S2 may be, for example, an etch, a deposition, a polish or an annealing step. As discussed above, the process step S2 distorts the substrate $W_n$ and therefore shifts the positions of features formed on the substrate from their nominal positions. Based on measuring the distortions in first layer L1 using alignment markers, a second layer L2 is exposed (step S3). Overlay between L1 and L2 is measured (step S4) in a known manner, e.g. using overlay marks with respective parts included within first layer L1 and second layer L2. The second layer L2 is then transferred into the substrate by process step S5. Measurement step S4 can be performed using a stand-alone measurement tool, such as a scatterometer. By measuring overlay in a standalone measurement tool, it is possible to obtain very precise measurements, from which displacements of the first features can be derived, without a detrimental effect on throughput. Further exposure and process steps are carried out as necessary to complete the devices.

Figure 3:
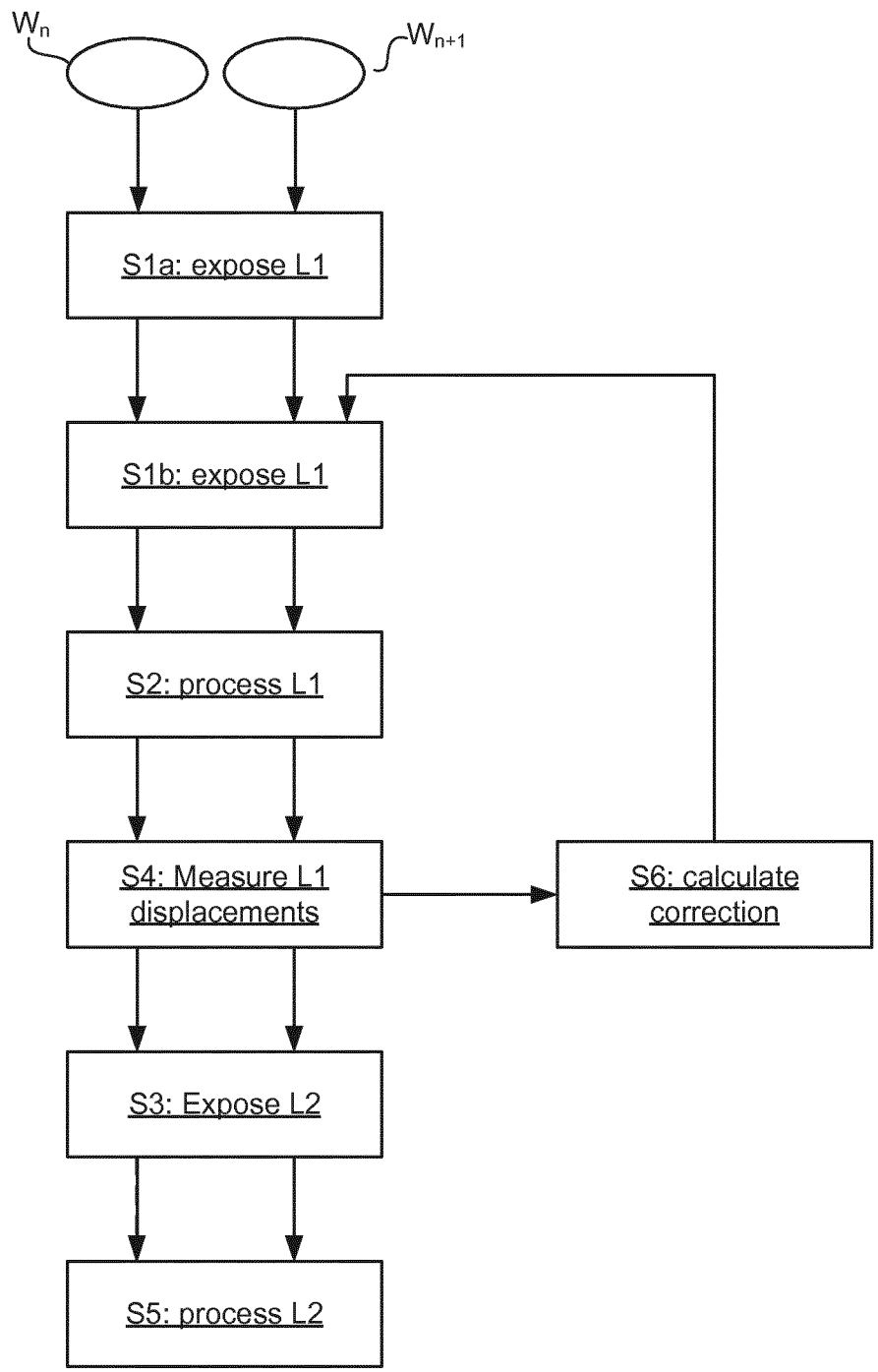
FIG. 3 depicts a flow chart of a method according to an embodiment of the invention.

In an alternative or additional embodiment a process such as depicted in FIG. 3 is applied. The process of FIG. 3 is the same as the process of FIG. 2 except as described below. The exposure step S1 of the FIG. 2 process is a two-step exposure in the FIG. 3 process. In the FIG. 3 process, the exposure step S1 comprises step S1a and S1b. The exposure of the second layer in step S3 occurs only after the measurement step S4.

The measurement step S4 of the FIG. 3 process determines displacements of features exposed in the first layer L1 in step S1a relative to features exposed in the first layer L1 in step S1b. In an embodiment in step S1a reference patterns are formed in the first layer L1 in a way to avoid or minimise any distortions. In an embodiment the reference patterns are exposed in such a way that they are free from imaging distortion, for example due to projection lens aberration.

In an embodiment a plurality of reference patterns are patterned into the first layer by repeatedly exposing the same reference mark of a patterning device onto the first substrate without moving the patterning device relative to the projection lens. Between exposures the first substrate is displaced relative to the lithographic apparatus (the projection lens in particular). As a result the reference patterns are exposed onto a plurality of positions on the substrate and are free from distortion as only a small area of the patterning device is exposed (i.e. the exposure is a mini-field exposure). In an alternative embodiment, a small area of the patterning device including a product feature or part of a product feature can be exposed with the pattern resulting in the first layer L1 being used as a reference pattern. In an alternative embodiment a pattern in a different patterning device or a pattern which is part of a table for supporting a patterning device can be exposed to form the reference pattern.

In the second exposure step S1b, further patterns (e.g. product patterns or metrology patterns) are formed in the first layer L1 in the normal way, for example using a step-and-scan exposure process in which a feature (e.g. product or metrology feature) in the patterning device is transferred to the first layer L1. The further patterns are subject to lens distortions, for example intra-field distortion resulting from lens aberration. This can be seen as full-field exposure. In an embodiment the plurality of further patterns formed in process step S1b are interlaced between the plurality of reference patterns.

In an embodiment both the first exposure step S1a and the second exposure step S1b are performed using a step-and-scan exposure step. In the first exposure step S1a the first substrate is positioned at a first focus level and a first plurality of reference patterns are formed during the step-and-scan exposure (the substrate maintained at the first focus level). In the second exposure step S1b the first substrate is positioned at a second focus level and a second plurality of reference patterns are formed during the step-and-scan exposure (the substrate maintained at the second focus level). In case of a pronounced distortion component induced by lens aberrations a fingerprint of (measured) positional deviations between the first and second plurality of reference patterns may be visible. The measured positional deviations may then be used to derive a distortion characteristic of the lithographic apparatus; eg. a fingerprint of the distortions resulting from the step-and-scan exposure can be determined.

Steps S1a and S1b may be performed the other way around.

In an embodiment, step S1a is not performed. In that case, in the measurement step S4 the position of the further patterns from their desired position is measured.

By measuring in measurement step S4 displacements of the further patterns relative to one or more reference patterns, following process step S2, a fingerprint of the distortions resulting from the step-and-scan exposure can be determined.

According to an embodiment of the invention, the measurement results from measure step S4 are used to calculate a correction in step S6 to be applied in the exposure of the first layer L1 (step S1 in the FIG. 2 process and step S1a in the FIG. 3 process) of one or more subsequent substrates $W_{n+1}$. The effect of the correction which is applied in the exposure of the first layer L1 of a subsequent substrate is that at least some of the features of the first layer L1 are imaged onto the subsequent substrate $W_{n+1}$ at adapted positions which are displaced from their nominal positions. The adapted positions are determined based on the results of measurement step S4 from the previous substrate $W_n$ so that after the distortions caused in process step S2, the features will end up at, or closer to, their nominal positions. This is explained further with reference to FIGS. 4 to 6. For subsequent substrates $W_{n+1}$, if following the process of FIG. 3, the exposure step S1a may be omitted if no measurement step S4 is envisaged.

In an embodiment a process including that depicted in FIG. 2 as well as that depicted in FIG. 3 is possible. In such a combined process the first exposure step could occur as depicted in FIG. 3 with the measurement step directly after the second process step S2 being performed and fed back to the subsequent substrate $W_{n+1}$. For the subsequent substrate $W_{n+1}$ the process according to FIG. 2 could be followed in which the first layer L1 is exposed with the correction calculated in step S6 of the FIG. 3 process prior to the first layer L1 being processed in step S2 and the second layer being exposed in step S3. Then the overlay error between first layer L1 and subsequent layer L2 would be measured in step S4 of FIG. 2. A further subsequent substrate $W_{n+2}$ would have its first layer L1 applied including the correction from step S6 of the FIG. 2 process, followed by the second layer L2 and processing of the second layer L2 in step S5.

Figure 4:
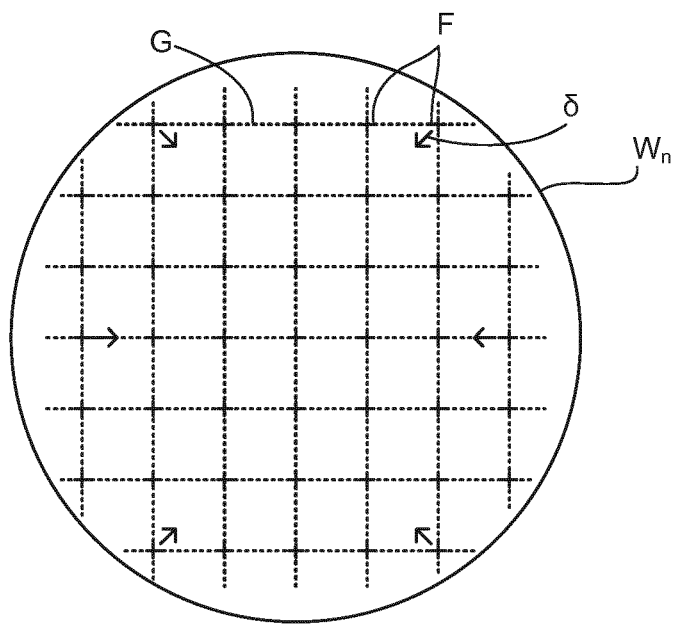
FIG. 4 depicts a substrate having a grid of features printed thereon.
Figure 5:
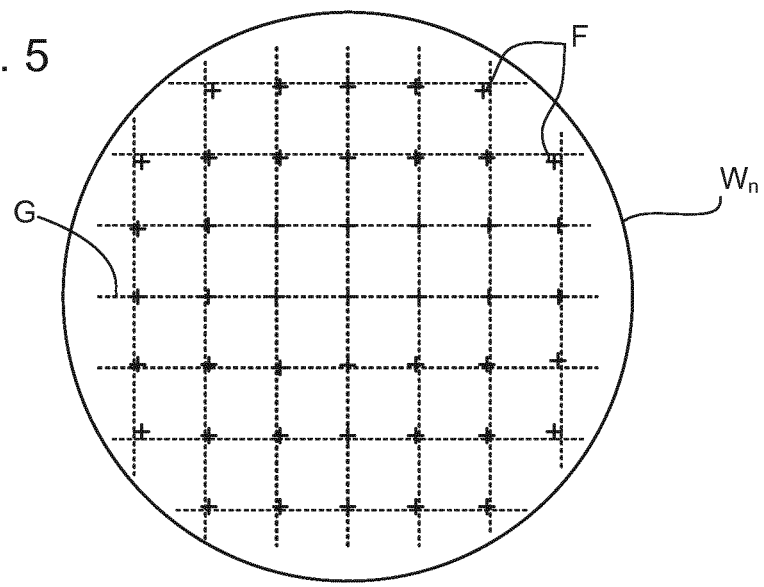
FIG. 5 depicts a substrate having a grid of features depicted thereon after process-induced distortion.

FIG. 4 depicts a substrate W on which a plurality of features F are formed. On exposure, features F are aligned on a virtual grid G, which is shown only for illustrative purposes. The grid G can be regarded as representing the coordinate system of the lithographic apparatus. Process step S2 distorts the substrate resulting in shifts of the actual positions of the features F as indicated by the arrows δ. Thus, after the process step S2, the substrate $W_n$ looks as shown in FIG. 5 where the features F are displaced from their nominal positions relative to the grid G. The displacements δ are determined in measurement step S4 (e.g. from measurements of overlay between L1 and L2 on $W_n$) so that the features F when imaged on to substrate $W_{n+1}$ can be placed at adapted positions, displaced from the grid G as shown in FIG. 6. This means that after process step S2 is carried out on substrate $W_{n+1}$ the features F will be displaced back to, or at least closer to, their nominal positions on the grid G.

By applying a pre-compensation to the first layer L1 of the subsequent substrates $W_{n+1}$ for the distortions expected to be caused by process step S2, the need to apply compensation in the exposure of subsequent layers L2 in the subsequent substrates $W_{n+1}$, is reduced or eliminated. This means that the necessary compensations do not accumulate as the various layers required to construct the device are formed and so the problem of the necessary compensations exceeding the capabilities of the lithographic apparatus used for the subsequent layers is avoided. Additionally it means that should the second layer L2 be exposed by a lithographic apparatus incapable of applying the subsequent layer L2 with a correction to account for the distortion in the first layer L1, overlay errors will not result as the distortions in the first layer L1 are not present in subsequent substrates $W_{n+1}$. Therefore, for example, if the process step S1 is performed in a DUV lithographic apparatus to form the first layer L1, the subsequent layer L2 may be formed in exposure step S3 in a different type of apparatus such as an EUV lithographic apparatus, and even if the EUV apparatus is incapable of taking account of distortions in the first layer L1, because those are minimised for subsequent substrates $W_{n+1}$, overlay error due to distortions is minimised.

Calculation of the pre-compensation to be applied to the first layer L1 in the subsequent substrates can be performed using the same approaches that have heretofore been used to calculate corrections to be applied in subsequent layers on the same substrate.

It will be noted that the distortions illustrated in FIGS. 4 to 6 are grossly exaggerated for illustrative purposes, the actual distortions occurring being of the order of nanometers. In addition, the distortion shown is a fairly simply shrinkage of the substrate whereas actual distortions occurring in use may be much more complex. Distortion can occur at inter-field scales as well as intra-field scales and can be very complex. The distortions may also involve out of plane deformations of the substrate as well as in-plane deformations.

In order further to minimize distortions in the first layer L1, known techniques may be applied before the exposure of step S1 of the first substrate $W_n$. For example, a compensation can be calculated to account for aberration of a projection system of the lithographic apparatus. The compensation is then applied during the process step S1. An example of such a compensation is disclosed in EP-A1-1,251,402, hereby incorporated in its entirety by reference. Another known way of reducing distortion in the first layer L1 is to calculate a factor dependent on a selected feature (for example the critical product feature of the first layer) and to correct for aberration of the projection system on the basis of that selected feature. The factor is then applied during the exposing step S1 of the first layer. An example of calculating and applying the factor dependent on a selected feature is disclosed in US 2014/0047397, the contents of which are hereby incorporated in its entirety by reference.

It is not often possible to directly measure the displacements of the product features F whose placement is most critical since the markers used to measure distortions of the substrate cannot be placed exactly at the same positions as the product features F. Nevertheless, sufficient markers can be included within the pattern layers to enable the displacements of the product features F to be modelled across the area of the substrate. Markers can be provided that are designed so as to experience similar distortions as product features F.

First layer L1 need not be the very first layer that is formed on the substrate in the device manufacturing process. Nevertheless, in many product designs it is the first few layers that are formed that are most critical so that use of the invention within the first few layers provides the greatest advantage. Reducing the corrections deriving from the earliest layers has the greatest effect in preventing such corrections accumulating as more layers are formed.

The present invention can be applied to multiple layers of the device. For example, pre-compensation is applied to layer L1 to address distortions that are expected in process step S2. Although this means that the exposure of layer L2 need include no or a reduced correction for the distortions of process step S2, it is then possible to introduce pre-compensation into the exposure of second layer L2 to address expected distortions from process step S5 which transfers layer L2 into the substrate. The same applies to later layers.

In the embodiment described above, the corrections are calculated on the basis of measurements of a preceding substrate. In the event that the effects of the process step are stable over time, it may be that measurements of only the first substrate in a batch need be performed and the same calculated corrections can be applied to all subsequent substrates in that or subsequent batches. However, if the distortions caused by the process step have a random component, it may be desirable to measure multiple substrates and base the corrections on an average or other statistical treatment of the measurement results. If the effect of the process step has a component which drifts over time, it may be desirable to base the corrections to be applied to a given substrate on measurements that are derived from an immediately preceding substrate. Due to the time taken for processing layer L1, exposing the second layer L2 and L1:L2 overlay measurements, in many cases the corrections applied to a given substrate will be derived from a preceding lot or batch of substrates. In some cases the pre-compensation may not perfectly correct the distortion introduced by the process step in which case the residual distortion can be measured and the pre-compensation improved for subsequent substrates. Combinations of these approaches are possible and an appropriate sampling scheme can be determined for a given process step and process apparatus taking into account its characteristics.

In addition to, or instead of, basing the pre-compensation on a measured positional shift between different patterns, also aberration data associated with the lithographic apparatus may be used. Aberration data allows prediction of a distortion fingerprint as induced by a lens component of the lithographic apparatus and hence may be utilized to predict a pre-compensation (fingerprint) which may remove at least partly certain distortion components after the patterning of the first layer. Alternatively the pre-compensation may be based on alignment data when the alignment data is available on a sufficiently dense grid on the first layer. In general alignment data may be considered representative of a distortion characteristic of the lithographic apparatus used to apply the alignment markers to the substrate. In case the alignment markers were applied by the lithographic apparatus of interest the alignment measurement data may be used as input for calculation of the pre-compensation. The alignment measurement is typically performed before exposure of a substrate, but may be performed also after exposure of a substrate. Advantage of basing the pre-compensation determination on aberration and/or alignment data is that no specific additional exposures need to be done in order to determine positional shifts between features.

Embodiments of the present invention can be used to reduce the corrections that need to be employed in subsequent layers formed on a substrate in magnitude and/or complexity. This improvement avoids or reduces the accumulation of complex corrections, which has several advantages. For example, since the distortions of subsequent layers are reduced in magnitude and/or complexity, those distortions can be measured with fewer measurements or can be measured with greater accuracy using the same number of measurements. Fewer measurements can improve throughput and/or may reduce the space on the substrate that is given over to markers rather than product features. If only simple corrections need to be applied, it may be possible to image subsequent layers using less advanced lithographic apparatus, whereas without the pre-compensation of the invention, an advanced lithographic apparatus might be required to apply corrections, even if the criticality of the subsequent layers did not require use of an advanced lithographic apparatus.

While specific embodiments of the invention have been described above, it will be appreciated that the invention may be practiced otherwise than as described.

Further embodiments of the invention are disclosed in the list of numbered embodiments below:

1. A device manufacturing method comprising:
    exposing a first substrate using a lithographic apparatus to form a patterned layer comprising first features;
    processing the first substrate to transfer the first features into the first substrate;
    determining displacements of the first features from their nominal positions in the first substrate;
    determining a correction to at least partly compensate for the displacements; and
    exposing a second substrate using a lithographic apparatus to form a patterned layer comprising the first features;
    wherein the correction is applied during the exposing the second substrate.

2. A method according to embodiment 1,
    wherein the exposing the first substrate comprises:
    a first exposure step of using the lithographic apparatus to form a plurality of reference patterns in different positions in the patterned layer by repeatedly displacing the first substrate relative to the lithographic apparatus and exposing a reference pattern onto the first substrate, the displacing determining the position of the formed reference pattern in the patterned layer; and
    a second exposure step of using the lithographic apparatus to form a plurality of further patterns as part of the first features in the pattered layer by using a step-and-scan exposure and a feature in the patterning device; and
    the determining displacements comprises:
    determining displacements of the plurality of further patterns relative to one or more of the plurality of reference patterns.

3. A method according to embodiment 1, wherein the determining of displacements of the first features is derived from lens aberration data associated with the lithographic apparatus.

4. A method according to embodiment 1, wherein the determining of displacements of the first features is derived from alignment data obtained before or after the step of exposing the first substrate using the lithographic apparatus.

5. A method according to embodiment 1,
    wherein the exposing the first substrate comprises:
    a first exposure step of positioning the first substrate at a first focus level and using the lithographic apparatus to form a first plurality of reference patterns in the patterned layer;
    a second exposure step of positioning the first substrate at a second focus level and using the lithographic apparatus to form a second plurality of reference patterns in the patterned layer; and
    determining the displacements of the first features from their nominal positions in the first substrate based on measured shifts in position between the first plurality of reference patterns and the second plurality of patterns.

6. A method according to embodiment 1 or 2 wherein determining displacements of the first features comprises:
    exposing the first substrate using the or a lithographic apparatus to form a second patterned layer comprising second features; and
    measuring overlay on the first substrate between the first and second features.

7. The method according to embodiment 6,
    wherein the exposing the first substrate using a lithographic apparatus to form a patterned layer comprising first features is performed in a first type of lithographic apparatus; and
    the exposing the first substrate using the or a lithographic apparatus to form a second patterned layer comprising second features is performed in a second type of lithographic apparatus different from the first type of lithographic apparatus.

8. A method according to any one of the preceding embodiments further comprising:
    processing the second substrate to transfer the first features into the second substrate;
    measuring displacements of the first features from their nominal positions in the second substrate;
    determining a residual correction to compensate for any residual displacement of the first features in the second substrate;
    exposing the second substrate using a lithographic apparatus to form a second patterned layer comprising second features, whilst applying the residual correction.

9. A method according to embodiment 8, wherein exposing the second substrate to form a first patterned layer is performed using a first lithographic apparatus and exposing the second substrate to form a second patterned layer is performed using a second lithographic apparatus, the second lithographic apparatus being of a different type than the first lithographic apparatus.

10. A method according to any one of the preceding embodiments further comprising:
    processing the second substrate to transfer the first features into the second substrate;
    determining displacements of the first features from their nominal positions in the second substrate;
    determining a residual correction to compensate for any residual displacement of the first features in the second substrate;
    using the residual correction to improve the correction;
    exposing a third substrate using a lithographic apparatus to form a patterned layer comprising the first features;
    wherein the improved correction is applied during the exposing the third substrate.

11. A method according to any one of the preceding embodiments further comprising:
    processing the second substrate to transfer the first features into the second substrate;

exposing the second substrate using a lithographic apparatus to form a second patterned layer comprising second features;

processing the second substrate to transfer the second features into the second substrate;

determining second displacements of the second features from their nominal positions in the second substrate;

determining a second correction to at least partly compensate for the second displacements; and exposing a third substrate using a lithographic apparatus to form a patterned layer comprising the second features;

wherein the second correction is applied during the exposing the third substrate.

12. A method according to any of the preceding embodiments further comprising:
calculating a compensation to account for aberration of a projection system of the lithographic apparatus and applying the compensation during exposing the first substrate using the lithographic apparatus to form the patterned layer comprising first features.

13. A method according to any of the preceding embodiments further comprising:
calculating a factor dependent on a selected feature of the first features to correct for aberration of a projection system of the lithographic apparatus with reference to the selected feature and applying the factor during exposing the first substrate using the lithographic apparatus to form the patterned layer comprising first features.

14. A method according to any one of the preceding embodiments wherein the processing comprises one of etching, deposition, polishing (CMP) and annealing.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A device manufacturing method comprising:
exposing a first substrate using a lithographic apparatus to form a patterned layer comprising first features;
processing the first substrate to transfer the first features into the first substrate;
determining displacements of the first features from their nominal positions in the first substrate, wherein the displacements are associated with distortions induced by a projection system of the lithographic apparatus and are separate from displacements, if any, of the first features associated with other distortions or errors;
determining a correction to at least partly compensate for the displacements; and
exposing a second substrate to form a patterned layer comprising the first features,
wherein the correction is applied for or during the exposing of the second substrate to form the patterned layer comprising the first features.

2. The method according to claim 1, wherein:
the exposing the first substrate comprises:
a first exposure step of using the lithographic apparatus to form a plurality of reference patterns in different positions in the patterned layer by repeatedly displacing the first substrate and exposing a reference pattern onto the first substrate, the displacing determining the position of the formed reference pattern in the patterned layer; and
a second exposure step of using the lithographic apparatus to form a plurality of further patterns as part of the first features in the patterned layer by using a step-and-scan exposure and a feature in the patterning device; and
the determining displacements comprises determining displacements of the plurality of further patterns relative to one or more reference patterns of the plurality of reference patterns.

3. The method according to claim 1, wherein the displacements of the first features are derived from projection system aberration data associated with the lithographic apparatus.

4. The method according to claim 1, wherein the displacements of the first features are derived from alignment data obtained before or after the exposing the first substrate using the lithographic apparatus.

5. The method according to claim 1, wherein:
the exposing the first substrate comprises:
a first exposure step of positioning the first substrate at a first focus level and using the lithographic apparatus to form a first plurality of reference patterns in the patterned layer; and
a second exposure step of positioning the first substrate at a second focus level and using the lithographic apparatus to form a second plurality of reference patterns in the patterned layer; and
the determining the displacements comprises determining the displacements of the first features from their nominal positions in the first substrate based on measured shifts in position between the first plurality of reference patterns and the second plurality of reference patterns.

6. The method according to claim 1, wherein the determining displacements of the first features comprises:
exposing the first substrate to form a second patterned layer comprising second features; and
measuring overlay on the first substrate between the first and second features.

7. The method according to claim 6, wherein:
the exposing the first substrate to form a patterned layer comprising first features is performed in a first type of lithographic apparatus; and
the exposing the first substrate to form a second patterned layer comprising second features is performed in a second type of lithographic apparatus different from the first type of lithographic apparatus.

8. The method according to claim 1, further comprising:
processing the second substrate to transfer the first features into the second substrate;
measuring displacements of the first features from their nominal positions in the second substrate;
determining a residual correction to compensate for any residual displacement of the first features in the second substrate; and
exposing the second substrate to form a second patterned layer comprising second features, wherein the residual correction is applied for or during the exposing of the second substrate to form a second patterned layer comprising second features.

9. The method according to claim 8, wherein exposing the second substrate to form a first patterned layer is performed using a first type of lithographic apparatus and exposing the second substrate to form a second patterned layer is performed using a second type of lithographic apparatus, the second type of lithographic apparatus being of a different type than that of the first type of lithographic apparatus.

10. The method according to claim 1, further comprising:
processing the second substrate to transfer the first features into the second substrate;
determining displacements of the first features from their nominal positions in the second substrate;
determining a residual correction to compensate for any residual displacement of the first features in the second substrate;
using the residual correction to improve the correction; and
exposing a third substrate to form a patterned layer comprising the first features,
wherein the improved correction is applied for or during the exposing of the third substrate.

11. The method according to claim 1, further comprising:
processing the second substrate to transfer the first features into the second substrate;
exposing the second substrate to form a second patterned layer comprising second features;
processing the second substrate to transfer the second features into the second substrate;
determining second displacements of the second features from their nominal positions in the second substrate;
determining a second correction to at least partly compensate for the second displacements; and
exposing a third substrate to form a patterned layer comprising the second features,
wherein the second correction is applied for or during the exposing of the third substrate.

12. The method according to claim 1, further comprising calculating a compensation to account for aberration of a projection system of the lithographic apparatus and applying the compensation for or during exposing of the first substrate using the lithographic apparatus to form the patterned layer comprising first features.

13. The method according to claim 1, further comprising calculating a factor dependent on a selected feature of the first features to correct for aberration of a projection system of the lithographic apparatus with reference to the selected feature and applying the factor for or during exposing of the first substrate using the lithographic apparatus to form the patterned layer comprising first features.

14. The method according to claim 1, wherein the processing comprises one or more selected from: etching, deposition, polishing and/or annealing.

15. A method comprising:
obtaining a first substrate exposed by a first lithographic apparatus to form a patterned layer comprising first features and processed subsequently to transfer the first features into the first substrate;
determining displacements of the first features from their nominal positions in the first substrate, wherein the displacements are associated with distortions induced by a projection system of the first lithographic apparatus and are separate from displacements, if any, of the first features associated with other distortions or errors; and
determining a correction to configure a second lithographic apparatus, wherein the correction at least partly compensates for the displacements when used during or for exposing a second substrate using the second lithographic apparatus to form a patterned layer comprising the first features.

16. The method according to claim 15, wherein the first lithographic apparatus and the second lithographic apparatus are the same.

17. The method according to claim 15, wherein the displacements of the first features are derived from projection system aberration data associated with the first lithographic apparatus.

18. The method according to claim 15, further comprising:
obtaining the second substrate having the first features formed thereon;
obtaining measured displacements of the first features from their nominal positions in the second substrate; and
determining a residual correction to compensate for any residual displacement of the first features in the second substrate.

19. A non-transitory computer-readable medium comprising instructions therein, the instructions, upon execution by a computer system, configured to cause the computer system to at least:
obtain displacements of first features in a first substrate from their nominal positions, wherein the displacements of the first features are obtained after exposure of the first substrate by a first lithographic apparatus to form a patterned layer comprising the first features and after processing of the exposed first substrate to transfer the first features into the first substrate and wherein the displacements are associated with distortions induced by a projection system of the first lithographic apparatus and are separate from displacements, if any, of the first features associated with other distortions or errors; and
determine a correction to configure a second lithographic apparatus, wherein the correction at least partly compensates for the displacements when used during or for exposing a second substrate using the second lithographic apparatus to form a patterned layer comprising the first features.

20. A non-transitory computer-readable medium comprising instructions therein, the instructions, upon execution by a computer system, configured to cause the computer system to at least:
- provide information to cause exposure of a first substrate using a lithographic apparatus to form a patterned layer comprising first features;
- obtain displacements of the first features in the first substrate from their nominal positions in the first substrate, wherein the displacements of the first features are obtained after processing of the exposed first substrate to transfer the first features into the first substrate and wherein the displacements are associated with distortions induced by a projection system of the lithographic apparatus and are separate from displacements, if any, of the first features associated with other distortions or errors;
- determine a correction to at least partly compensate for the displacements; and
- provide information to cause exposure of a second substrate to form a patterned layer comprising the first features, wherein the correction is applied for or during the exposure of the second substrate to form the patterned layer comprising the first features.

* * * * *